(12) United States Patent
Brasile

(10) Patent No.: US 8,467,849 B2
(45) Date of Patent: Jun. 18, 2013

(54) MAGNETIC RESONANCE IMAGING DEVICE

(75) Inventor: Lauren Brasile, Albany, NY (US)

(73) Assignee: Orgamend Inc., Albany, NY (US)

(*) Notice: Subject to any disclaimer, the term of this patent is extended or adjusted under 35 U.S.C. 154(b) by 847 days.

(21) Appl. No.: 11/347,560

(22) Filed: Feb. 3, 2006

(65) Prior Publication Data

US 2006/0270930 A1 Nov. 30, 2006

Related U.S. Application Data

(60) Provisional application No. 60/649,673, filed on Feb. 3, 2005.

(51) Int. Cl.
*A61B 5/055* (2006.01)
*G01V 3/00* (2006.01)
*A41C 3/00* (2006.01)
*A41B 9/00* (2006.01)

(52) U.S. Cl.
USPC ............ 600/421; 324/309; 450/3; 2/73

(58) Field of Classification Search
USPC ........................................... 600/422
See application file for complete search history.

(56) References Cited

U.S. PATENT DOCUMENTS

| | | | |
|---|---|---|---|
| 4,819,275 A * | 4/1989 | Lunt ........................... | 2/114 |
| 5,339,033 A * | 8/1994 | Eilenberg et al. ............ | 324/309 |
| 5,938,500 A * | 8/1999 | Hampton ..................... | 450/32 |
| 6,544,100 B1 * | 4/2003 | Nadsady et al. .............. | 450/38 |
| 6,850,065 B1 | 2/2005 | Fujita et al. .................. | 324/318 |
| 6,933,721 B2 * | 8/2005 | Vavrek et al. ................ | 324/309 |
| 7,084,631 B2 | 8/2006 | Qu et al. ...................... | 324/318 |
| 7,514,926 B2 | 4/2009 | Adriany et al. ............... | 324/318 |
| 2001/0007076 A1 | 7/2001 | Jesseph ........................ | 606/130 |
| 2005/0104591 A1 | 5/2005 | Qu et al. ...................... | 324/318 |
| 2006/0270930 A1 | 11/2006 | Brasile ......................... | 600/410 |
| 2008/0177180 A1 | 7/2008 | Azhari et al. ................. | 600/439 |
| 2010/0041979 A1 | 2/2010 | Hartner ........................ | 600/411 |

* cited by examiner

*Primary Examiner* — Long V. Le
*Assistant Examiner* — Angela M Hoffa
(74) *Attorney, Agent, or Firm* — Heslin Rothenberg Farley & Mesiti P.C.

(57) ABSTRACT

The present invention provides a device for use in magnetic resonance imaging of a woman's breasts. The device has breast-supporting cups that comprise an enhanced fat saturation material to facilitate fat suppression during imaging. Significantly, the wearer can put the device on and position it with little or no assistance and without loss of dignity due to manipulation by a technician.

3 Claims, 7 Drawing Sheets

Traditional Breast MRI
(Prior Art)

MAGNETIC RESONANCE IMAGING DEVICE

CROSS REFERENCE TO RELATED APPLICATIONS

This application claims the priority of U.S. provisional application, Ser. No. 60/649,673, the contents of which are hereby incorporated by reference into the present application.

FIELD OF THE INVENTION

The invention relates to a device and system for improving fat saturation during magnetic resonance imaging (MRI). More particularly, the invention relates to a breast positioning that utilizes an MR imaging device designed specifically for improving imaging of a patient's breasts.

BACKGROUND OF THE INVENTION

Magnetic resonance imaging (MRI) of the breast has emerged as an important new diagnostic tool for the detection of tumors. Pre-surgical MRI can help to reduce the number of biopsies that need to be taken by distinguishing benign from malignant tumors. Likewise, MRI techniques provide opportunities for staging malignant tumors that can play an important role in breast preserving surgery. More recently, MRI has been employed to achieve MR-guided subcutaneous core biopsies, allowing for coordination of minimally invasive surgery. Introducing contrast agents such as gadolinium-diethylene triamine-pentaacetic acid (Gd-DTPA) during MR imaging provides sensitivity approaching 100%. An added benefit of MRI is the ability to accomplish sentinel node identification with simultaneous fat suppression. Following surgery for tumor excision, MRI is the modality of choice for the detection of residual disease. MRI is also the modality of choice for evaluating the integrity of breast implants.

The components involved in magnetic resonance imaging (MRI) include a primary magnet, computer controlled shim coils to produce field homogeneity, gradient coils to generate linear fields, radio frequencies (rf) for transmitting rfpulses and also for receiving MR imaging signals unless separate receiving coils are integrated, and advanced specialized software for data acquisition, analysis and pulse sequence. MR imaging involves exposing nuclei to a strong magnetic field and then excitation by rf resonant energy.

Despite the sensitivity MR imaging provides over more traditional imaging modalities, such as mammography or ultrasound, there are several technological hurdles. While providing exceptional sensitivity, it displays variable specificity that represents a major limitation. Given this varying specificity, when tumors are detected by MR imaging that cannot be identified with more traditional imaging modalities, patient management decisions are difficult.

To aid enhanced MR imaging of the breast, MRI equipment manufacturers have developed and marketed breast coils. Breast coils are usually whole-volume solenoids used for transmission and receiving. Resonators are applied over the breast, usually in pairs, to allow for simultaneous imaging of both breasts. The quality of the MR image produced can be enhanced by the optimal use of an independent coil, called a surface coil, placed close to the area being imaged in order to improve the strength of any received signal. Many of the breast coils are system and/or manufacturer specific.

In using the above-mentioned breast coils, the female patient lies face down and head first. The breasts must be positioned in the center of the coils. The salient feature common to all of these breast coils is the need to adequately position the breasts, which are hanging pendulantly. Another common feature of the breast coils is the need for some form of compression to immobilize the breasts within the coil to properly position breasts for imaging and adapt the apertures for variation in individual breast size. These "one size fits all" breast coils rely on manual compression of the breast tissue by an MR imaging technician.

The need to disrobe and have one's breasts manipulated, positioned and compressed by a stranger can be an uncomfortable and intimidating experience for a female patient. It is also a major reason why women avoid routine breast screening. The imaging device of the present invention can be applied by the patient herself in the privacy of a dressing room unlike the MR imaging devices for the breast in use today where the breasts must be positioned by a technician. Since almost all women know their appropriate brassiere size and also know how to position it on their anatomy, an imaging device which adopts a brassiere or corset design represents an easy to use and comfortable configuration. Just as importantly, it provides a sense of independence and dignity in an otherwise intimidating process.

SUMMARY OF THE INVENTION

In one aspect, the invention relates to a device for magnetic resonance imaging of a patient's breasts, said device comprising a torso-encircling bodice portion adapted to be fastened around the torso of the patient and first and second breast-supporting panels or cups, the panels or cups comprising a fat saturation enhancing material, for example a non-protonated, material, wherein the cups are releasably attached to the torso-encircling bodice portion. The shape of the breast-supporting cups corresponds generally to the contour of the wearer's breasts, wherein the cup comprises a nonaqueous solid or liquid fat saturation enhancing material.

In another aspect, the invention relates to a device for magnetic resonance imaging of the breasts further comprising a pair of roughly circular cups for covering the breasts, each defining a curved lower edge removably attached to the upper edge of the torso-encircling bodice portion, with first fasteners fixedly secured to upper edge of the cups and second fasteners on the upper edge of the bodice portion for cooperating with the fasteners to fixedly attach the cups to the torso-encircling bodice portion, wherein the cups are fixedly attached and remain immovable with respect to the bodice portion at the position defined by the attachment despite movement by the wearer.

BRIEF DESCRIPTION OF THE DRAWINGS

FIGS. 4b and 4c are side views of the embodiment illustrated in FIG. 4a.

DETAILED DESCRIPTION OF THE INVENTION

Figure 1:
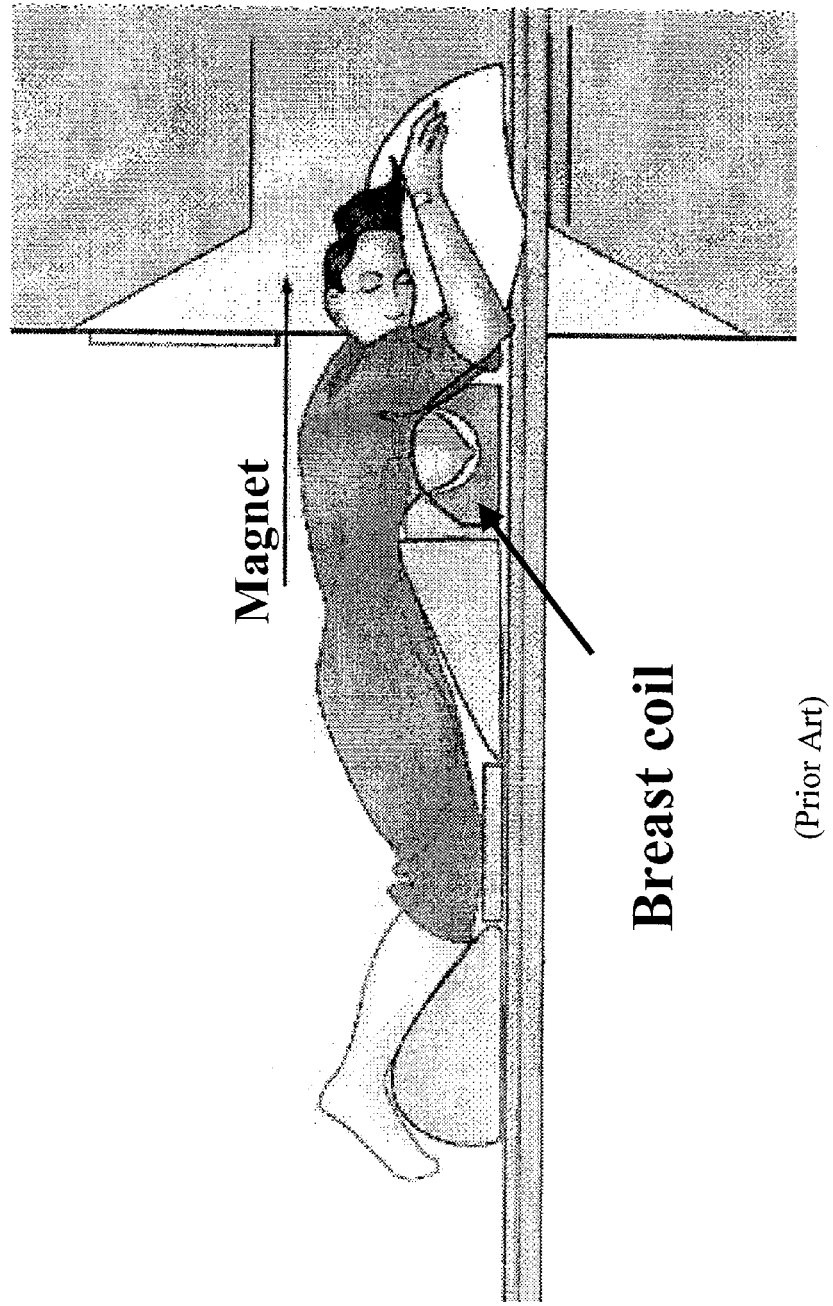
FIG. 1 is a diagram of a traditional breast MRI.

As shown in FIG. 1, traditional breast MRI requires the patient to lie prone upon a breast array coil with exposed breasts suspended into the breast coil.

Figure 2:
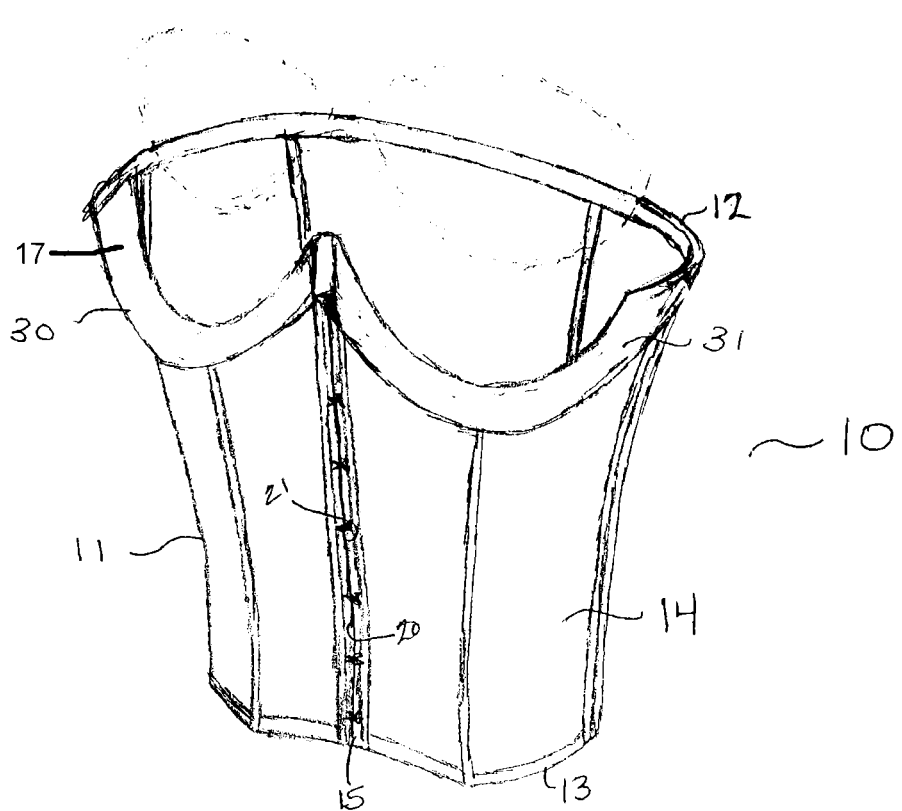
FIG. 2 is a perspective view of one embodiment of the imaging device of the invention.

The present invention provides an MR imaging device 10 which the patient, with minimal instruction and little or no assistance, can put on and position prior to imaging. One embodiment is shown in FIG. 2. MR imaging device 10 generally comprises a torso-encircling bodice portion 11 which can be fastened around the wearer's torso having a pair of apertures in the front of the torso-encircling bodice portion into which first and second breast supporting cups can be inserted and releasably attached.

Torso-encircling bodice portion 11 may be formed of a sheath of resilient fabric 14 having an upper edge 12 and a lower edge 13. Resilient fabric 14 is made of a suitable material that will not interfere with the image during the MR examination. One such material is polyester, or a polyester blended with Spandex® or Lycra® for elasticity. In the embodiment shown in FIG. 2, bodice portion 11 is formed to surround the rib cage of the wearer from the under arm area down to the bottom rib to provide maximum support for the breasts.

In the embodiment shown in FIG. 2, torso-encircling bodice portion 11 has a front, releasable closure 15, formed by side edges 20 and 21. Side edges 20 and 21 are detachably joined by suitable, strip fasteners known in the art that will not interfere with the image during the MR examination (MR-invisible fasteners). In the embodiment shown in FIG. 2, a plurality of fasteners 18, for example, TEFLON® hooks 18a and eyes 18b, are utilized as MR-invisible fasteners. Other MR-invisible fastening means may be used in lieu of TEFLON® hooks 18a and eyes 18b. For example, in alternate embodiments (not shown), side edges 20 and 21 have adhesive strips or the hook-and-pile type fasteners (such as VELCRO®-brand fasteners) to detachably join side edges 20 and 21. Providing releasable closure 15 allows the patient to easily don imaging device 10 and adjust imaging device 10 to fit as snuggly as possible, thereby providing maximum support for the breasts.

Figure 5:
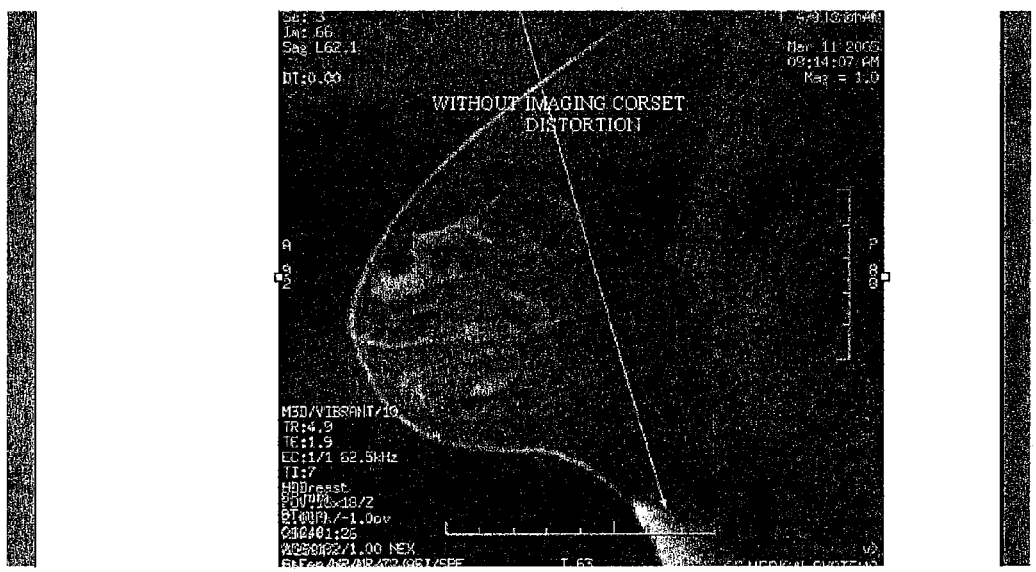
FIG. 5 is an MR image of a breast using a conventional breast imaging coil without the imaging device of the invention.

In the embodiment shown in FIG. 5, torso-encircling bodice portion 11 has a back, releasable closure. This embodiment further comprises first and second apertures positioned in the front of bodice portion 11 to receive first and second breast-supporting cups.

First and second breast-supporting cups comprise any fat saturation enhancing material. Suitable materials include TEFLON®, silicone, plastic alloy, acrylic, polyvinyl chloride, acrylonitrites, butadienes, styrenes, polyether imide, siloxane polyether imide block copolymer, polyphenylene oxide, modified polyphenylene oxide and polyphenylene ether.

In one embodiment, first and second breast-supporting cups are made, for example by injection molding, using a rigid or semi-rigid fat saturation material The breast-supporting cups are manufactured in a range of sizes so that women of various sizes may choose cups that fit snugly but comfortably. It is important that the rim or edge of the cup that is in contact with the chest wall, fit snugly around the breast.

The outer circumference of the breast-supporting cup is slightly smaller than the circumference of the aperature in the breast array coil so that the breast-supporting cup may be easily inserted into the aperature. The inner contour of the breast-supporting cup is variable, so that there are different cup sizes for different size breasts.

Prior to imaging, the wearer chooses an imaging device corresponding to her bra size and puts on the device in the same way she would put on a bra positioning the breast-supporting cups so that each breast is roughly entered within the cups. The patient then lies prone on the breast array coil with the breast-supporting cups of the imaging device inserted into the aperatures in the breast array coil. The need for manipulation of the woman's breast by a technician is obviated by the wearer's ability to don and position the device herself.

Referring further to FIG. 2, curved panels 30 and 31 each extend outwardly from upper edge 12 of resilient sheath 14 to form upwardly open strips adapted to correspond to the contour of a patient's breasts. As can be seen in FIG. 2, panel 31 is identical to panel 30. Panels 30 and 31 are positioned extend out two inches from the chest wall. Imaging device 10 positions the breasts by immobilizing and supporting the breasts on the bottom and sides in a fashion similar to an underwire brassiere (see FIG. 3). The imaging device shown in FIG. 2, is a breast positioning and biopsy system worn by the patient and since the imaging device stays with the patient once applied, there is no need for the patient to lie face down, as one does with the current commercially available systems.

In accordance with the invention, panels 30 and 31 are filled with fat saturation enhancing materials that are well known the art and disclosed, for example, in U.S. Pat. No. 5,414,358. These materials include fluorocarbons such as perfluorooctylbromide (PFOB), perflourodeclybromide (PFDB), FC-77 and FC-43. In a preferred embodiment, panels 30 and 31 have an inner filler material suitable to support the shape of panels 30 and 31 and to reduce the weight of panels 30 and 31 when filled with the fat saturation enhancing material. Such materials include silica, diatomaceous earth, polyurethane foam, rubber foam, polyester, absorbent cloth or absorbent paper and are further disclosed in U.S. Pat. No. 5,414,358.

Panels 30 and 31 may be formed within resilient sheath 14 or separately formed and secured thereto using conventional attachment means such as adhesives, glue and the like. Panels 30 and 31 are formed of a flexible, durable material which has no magnetic susceptibility. The material should not be permeable to fluorocarbons or the like and should allow panels 30 and 31 to conform to the shape of the breasts and fit snugly. Examples include polyurethane and polyethylene/polyester. In the preferred embodiment shown here, panels 30 and 31 are lined with MRI-enhancing material(s), such as a solid fluorocarbon polymer compound
(TEFLON® or GORTEX®, or other generic polytetrafluoroethylene) or oils.

Lining panels 30 and 31 with an MRI-enhancing material increases reception efficiency and, in effect, increases the rf sensitivity in collection of the signals and impacts the refractive index leading to improved signal quality. These materials also provide added reinforcement and tensile strength, resulting in additional support, shape configuration and immobilization. In addition, adding linings increases the durability of imaging device 10 with heavy use.

The sizing of imaging device 10 corresponds to the circumference of the wearer's chest and can be manufactured according to the clothing industry standards to provide a range of sizes. Alternatively, a sizing scale similar to that used in the brassiere sector can be employed, for example, 28-30 inches, 32-34 inches, 36-38 inches, 40-42 inches and 44-46 inches.

Unlike other breast positioning and biopsy systems, imaging device 10 of the present invention does not require repositioning during diagnostic procedures because full access to the patient's breasts is provided while the breasts remain positioned by imaging device 10. Imaging device 10 of the present invention facilitates access to the wearer's breast from virtually any angle while the breasts are simultaneously immobilized. Therefore, there is no need to remove imaging device 10 during MR screenings, biopsy or the administration of contrast agent(s). Likewise, there is no need to reposition the patient's breasts during imaging procedures since the breast is securely positioned and supported within imaging device 10, independent of the table or coil within the magnetic field.

In addition, the breast positioning and biopsy system of the present invention provides opportunities for imaging in multiple positions. Since imaging device 10 is fitted directly onto, and worn by the patient while the breasts are positioned and immobilized, MR screenings are not limited to a face down, prone position as is the case with conventional breast coils. The requirement that patients lay face down with their breasts pendulantly suspended, limits MR imaging studies to a single angle. Similarly, imaging device 10 immobilizes and positions the breast sufficiently to eliminate the necessity of having to use direct compression that is a concomitant aspect of present day imaging modalities for the breast. Inasmuch, screenings are not limited to a single position. Rather multiple positions can be employed including standing, lying on either side or face up.

Figure 3:
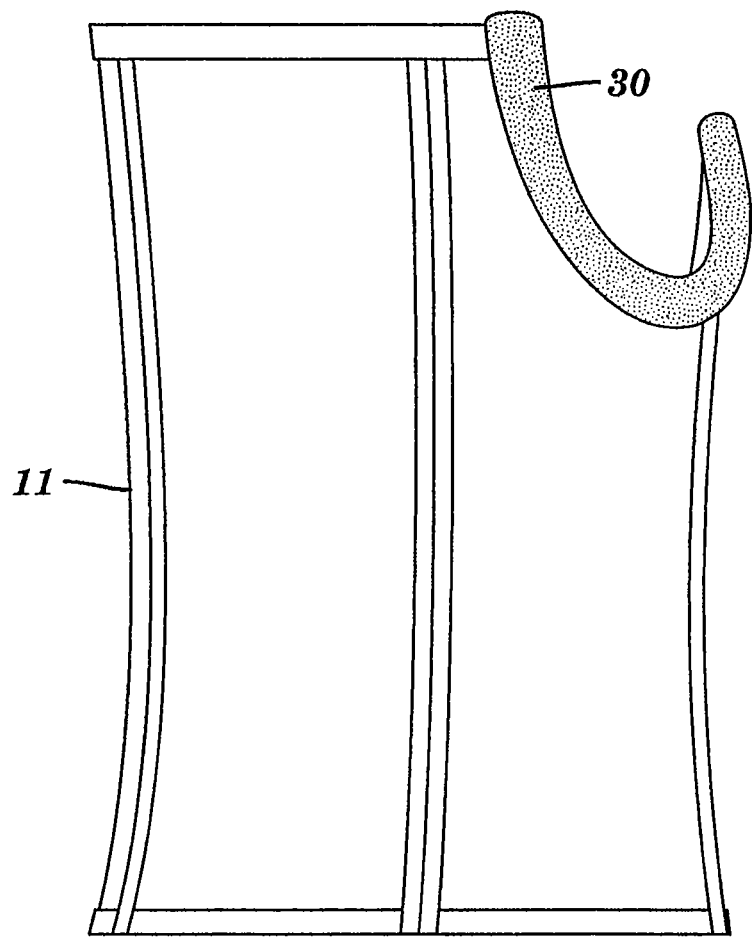
FIG. 3 is a side view of one embodiment of the imaging device of the invention.

FIG. 3 is a side view of one embodiment of a imaging device 10 according to the invention. As shown in FIG. 3, reinforced panels 30 and 31 of imaging device 10 are positioned beneath the wearer's breasts and surround the breasts, providing support to the breasts both laterally and from underneath in a manner similar to a conventional brassiere. More specifically, imaging device 10 supports the patient's breasts on a perpendicular plane to the spine while simultaneously providing an aperture to involve the whole breast and axillary node areas. In this way, the patient's breasts are positioned and largely immobilized without compression and remain in their natural configuration.

Further immobilization of the breasts can be obtained by the use of a support strap (not shown) removably attached, via conventional non-metal fasteners well known in the art including adhesives and VELCRO®, to the top of flange 30. The support strap travels behind the neck of the patient and is removably attached to the top of flange 31. Using conventional means well known in the art such as the support strap can be adjusted for length to adapt to variations in anatomy and to securely attach to panels 30 and 31.

Figure 4A:
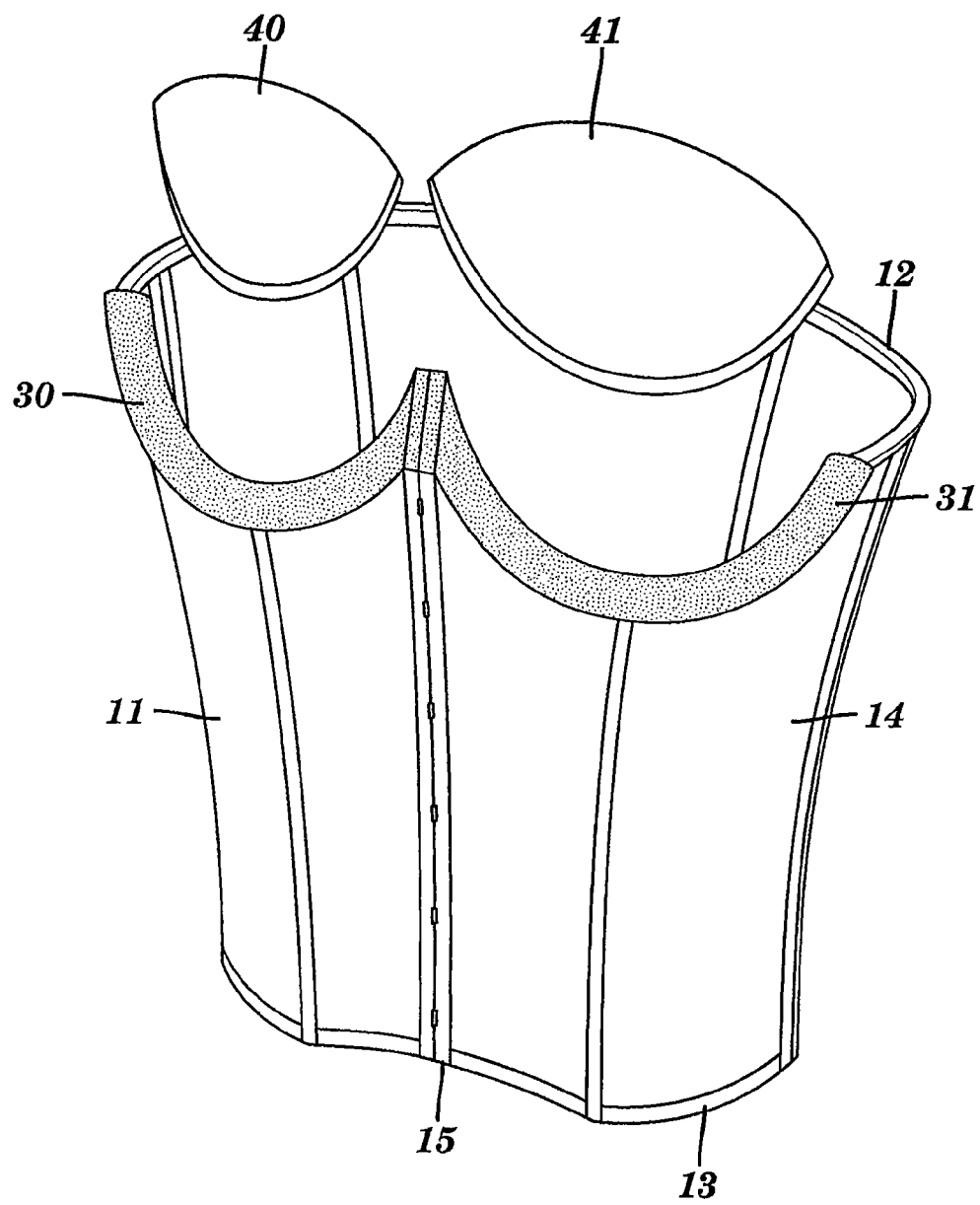
FIG. 4a is a perspective assembly view of another embodiment of the imaging system with breast covers according to the invention.
Figure 4C:
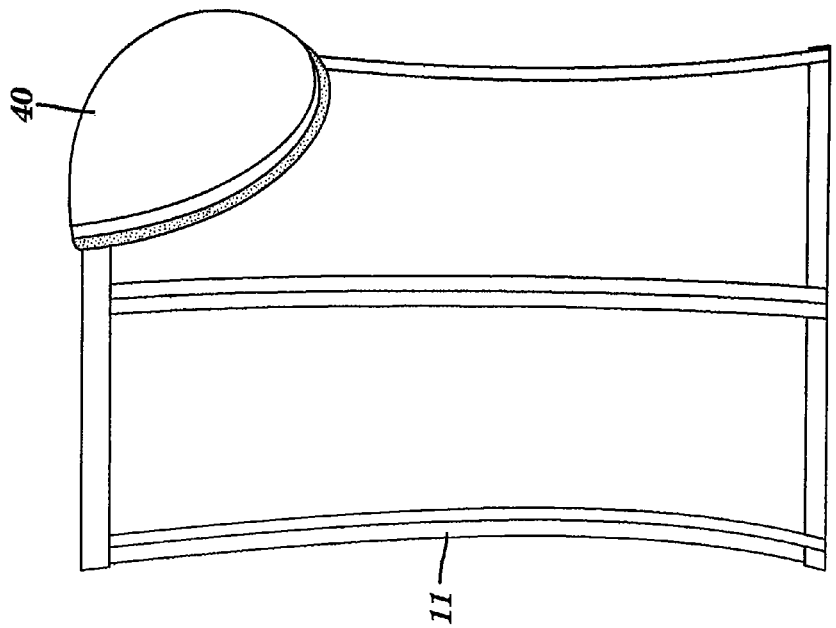
Figure 4B:
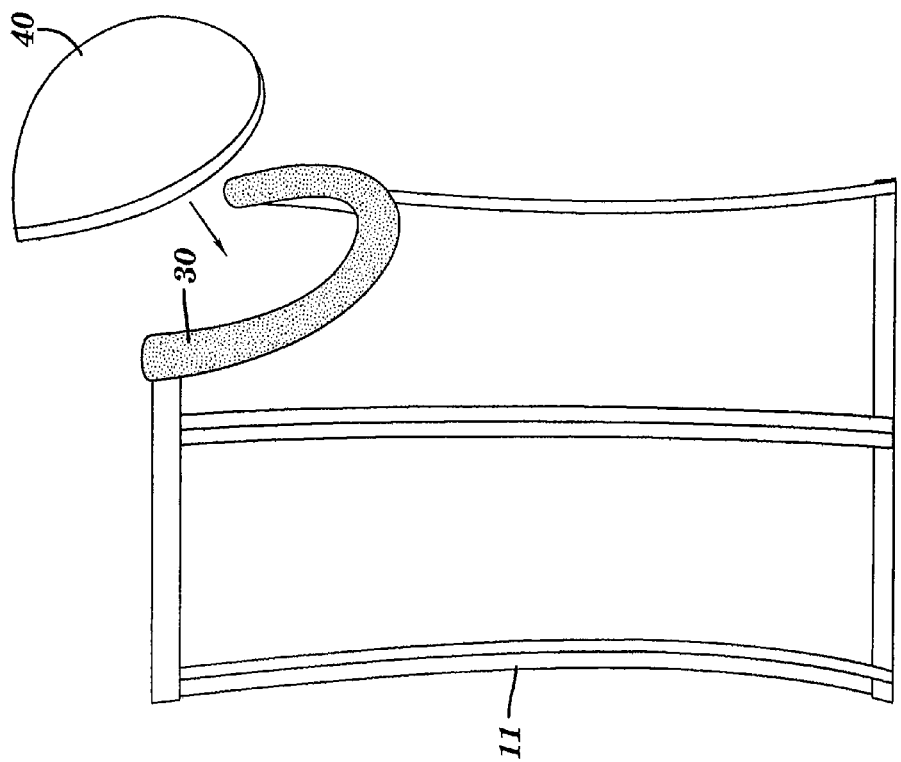

FIG. 4a is a perspective assembly view of another embodiment of an imaging device system with breast covers according to the invention. FIGS. 4b-c are side views of the alternate embodiment illustrated in FIG. 4a.

Referring to FIG. 4a, in another embodiment of the present invention, imaging device 10 includes a pair of breast-supporting cups 40 and 41, each defining curved lower edges. Cup 41 is identical to cup 40. The lower edges of cups 40 and 41 are removably secured to upper edge 12 of bodice portion 11 via suitable attachment means such that once cups 40 and 41 are secured, they remain immovable with respect to the remainder of imaging device 10. It will be apparent to those skilled in the art however that alternative approaches to attaching cups 40 and 41 to upper edge 12 of bodice portion 11 may be utilized without departing from the spirit and scope of the present invention. For example, suitable attachment means would include any MR-invisible apparatus wherein cups 40 and 41 are pressed in place, slid into place, snapped into place or the like. However, once attached, the cups are immovable with respect to the remainder of the garment. Thus, firm breast support is maintained despite movements by the wearer.

Figure 6:
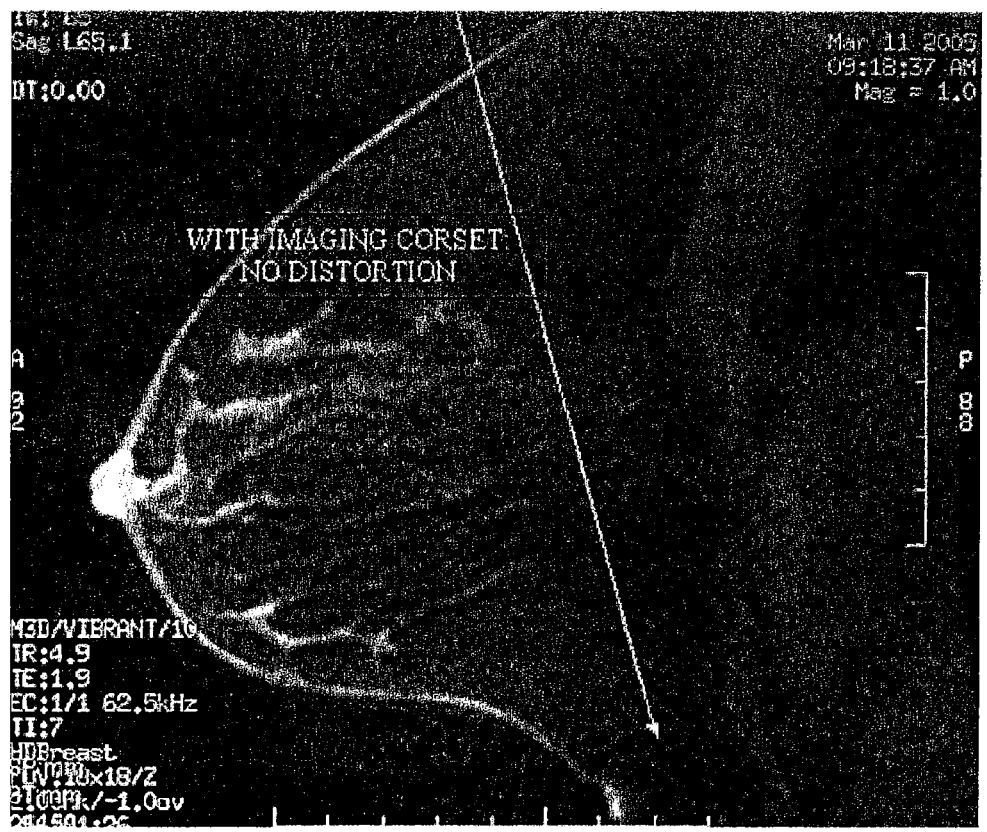
FIG. 6 is an MR image of a breast using a conventional breast imaging coil in conjunction with the imaging device of the invention.

Referring to FIGS. 4b and 6, following application of imaging device 10 to the patient's torso, the exposed breast area is then covered by a size specific cup 40 and 41. Cups 40 and 41 are removably secured, providing the advantages of multiple cup shapes and types to suit the needs of the wearer, thus adding greatly to the usefulness and flexibility of imaging device 10. In this way, the patient may independently choose a bodice portion 11 suited to her torso size and shape and attach breast-supporting cups 40 and 41 corresponding to her breast size. The size of cups 40 and 41 that cover the exposed breasts is consistent with present day brassier sizing.

In one embodiment, cups 40 and 41 are lined with MRI-enhancing material(s), such as a solid fluorocarbon polymer compound (TEFLON® or GORTEX®, or other generic polytetrafluoroethylene) or oils. Lining cups 40 and 41 with an MRI-enhancing material increases reception efficiency and, in effect, increases the rf sensitivity in collection of the signals and impacts the refractive index leading to improved signal quality. Improvements in signal quality in turn increase the signal-to-noise ratio resulting in better quality signals that provide better images.

In one embodiment, the imaging device comprises breast support cups that are injection molded or thermoformed and which completely fill the openings of the breast array coil. Similar to the examples listed above, the injection molded or thermoformed corset can accommodate variation in breast size. The exterior dimensions of the cup(s) remain constant in order to uniformly and completely fill the aperture of the breast coil. Variations in breast size are accommodated by altering the internal space of the cup rather than the exterior as with conventional brassieres. The volume that the breast displaces within each injection molded or thermoformed breast cup is accommodated by adjusting the internal molded wall thickness. For example, breasts sized A displace approximately 2 ounces of volume, B displaces 4 ounces, C displaces 6 ounces, and so on.

The molded breast cups can be configured to accommodate the breast when pendulant so that the need for additional compression is eliminated. The injection molded breast cup can be made to be rigid, semi-rigid or flexible. The molded breast cup can be made from a variety of non-metal materials, including teflons, silicones, plastic alloys made from various components and in various concentrations. Examples include polyether imides (PEI) commercially available under the name ULTEM™, siloxane PEI block copolymer, commercially available as SILTEM™, and modified polyphenylene oxides (PPO) such as NORYL™.

In another embodiment, the imaging device of the invention utilizes an injection molded outer cup used in conjunction with a similarly molded inner cup and filled with an imaging enhancing fluid to improve the quality of the image obtained with magnetic resonance. The improvements of combining a two-layered injection molded cup with an image enhancing fluid interface would be the elimination of pooling of the liquid and the risk of leakage due to puncture or rupture that occurs when using a film based device.

Referring to FIG. 5, in another embodiment of the present invention, bodice portion 111 of imaging device 100 surrounds the rib cage and is manufactured with a continuous sheath made of a sufficiently flexible and resilient material that will provide adequate structural support. In this embodiment, the circumference of sheath is uninterrupted, alleviating the need for a front, releasable closure. Again, sheath is of a sufficient length to provide a lower portion extending downwardly to the wearer's lower torso and an upper portion extending above the midriff or bodice portion of the wearer.

A number of variations on the preferred embodiment of the invention are possible without changing the character or the function of imaging device 10. For example, in an alternate embodiment (not shown), imaging device 10 and cups 40 and 41 can be lined with a disposable sanitary liner that is attached to bodice portion 11 with suitable attachment means, such as VELCRO®. In another embodiment (not shown), underwires can be secured to the upper edge of bodice portion to provide further support to the wearer's breast. In yet another embodiment (not shown), a disposable circular breast cup can be embedded with MR-visible markings that can be used to demarcate the breast surface and provide coordinates to facilitate tumor location within the breast.

In one embodiment, the imaging device of the present invention is used in combination with any of the various breast coils that are currently in clinical use. In an industry where MR coils are manufacturer and system specific, the circular breast covers of the imaging device system of this invention easily fit into the existing apertures in the various breast coils. In an alternate embodiment, secondary surface coils to define the breast volume to enhance the MR image of the breasts can be incorporated directly into the imaging device system. The imaging device system could then be used independently of a traditional secondary breast coil.

For example, a circumferential groove in each of the panels of the imaging device that positions and supports the breasts to be imaged can be fitted with a conventional flat single-loop detection coil. Alternatively, a high efficiency quadrature type coil could be incorporated. The coils can be activated singly or in synchrony. Obviously, various coil configurations can be envisioned and incorporated into the imaging device system with the goal of optimizing the field homogeneity and providing enhanced image quality.

The invention claimed is:

1. A device for magnetic resonance imaging of a patient's breasts comprising:
   a torso-encircling bodice portion adapted to be fastened around the torso of the patient; and
   first and second breast-supporting panels extending outwardly from an upper edge of said bodice portion to form a pair of upwardly open cups that conform snuggly to a portion of the breast near the chest wall, wherein said first and second breast-supporting panels comprise a nonaqueous solid or liquid fat saturation enhancing material selected from the group consisting of perfluorooctylbromide (PFOB), perfluorodecylbromide (PFDB), FC-77 and FC-43.

2. The device of claim 1 wherein said fat saturation material is for enhancing magnetic resonance imaging.

3. The device of claim 1 adapted to be used in combination with a magnetic resonance imaging breast coil.

* * * * *